(12) United States Patent
Montagne et al.

(10) Patent No.: US 7,636,379 B2
(45) Date of Patent: Dec. 22, 2009

(54) PUMPING SYSTEM FOR A LASER SOURCE AND LASER SOURCE COMPRISING SUCH A PUMPING SYSTEM

(75) Inventors: Jean-Eucher Montagne, Orleans (FR); Marc Le Neve, Orleans (FR)

(73) Assignee: Compagnie Industrielle des Lasers Cilas, Orleans (FR)

( * ) Notice: Subject to any disclaimer, the term of this patent is extended or adjusted under 35 U.S.C. 154(b) by 64 days.

(21) Appl. No.: 11/402,852

(22) Filed: Apr. 13, 2006

(65) Prior Publication Data
US 2006/0239323 A1 Oct. 26, 2006

(30) Foreign Application Priority Data
Apr. 25, 2005 (FR) .................................. 05 04110

(51) Int. Cl.
*H01S 3/091* (2006.01)
(52) U.S. Cl. .................. 372/70; 372/50.11; 372/50.12; 372/71; 372/72; 372/75
(58) Field of Classification Search .............. 372/50.11, 372/50.12, 102, 70, 71, 72, 75
See application file for complete search history.

(56) References Cited

U.S. PATENT DOCUMENTS

| 5,115,444 | A | * | 5/1992 | Kirkby et al. | ............ 372/50.22 |
| 5,386,426 | A | * | 1/1995 | Stephens | ...................... 372/20 |
| 5,513,201 | A | * | 4/1996 | Yamaguchi et al. | ........... 372/75 |
| 5,594,752 | A | * | 1/1997 | Endriz | ......................... 347/241 |
| 6,760,151 | B1 | | 7/2004 | Vail et al. | |
| 7,103,081 | B2 | * | 9/2006 | Nomaguchi | .............. 372/49.01 |
| 2001/0019570 | A1 | | 9/2001 | Cabaret et al. | |
| 2004/0008742 | A1 | * | 1/2004 | Chou et al. | .................... 372/18 |
| 2005/0018743 | A1 | * | 1/2005 | Volodin et al. | .............. 372/102 |

FOREIGN PATENT DOCUMENTS

FR 2803697 7/2001

OTHER PUBLICATIONS

Preliminary Search Report dated Nov. 29, 2005 with English translation.

\* cited by examiner

Primary Examiner—Minsun Harvey
Assistant Examiner—Yuanda Zhang
(74) Attorney, Agent, or Firm—Dickinson Wright PLLC

(57) ABSTRACT

A pumping system for a laser source includes a pump diode that emits a pump beam having a central wavelength that varies with temperature. A selective mirror having a plurality of spectral reflectivity peaks, corresponding to a plurality of predetermined wavelengths, locks the operation of the pump diode onto one of the predetermined wavelengths in accordance with temperature.

7 Claims, 5 Drawing Sheets

PUMPING SYSTEM FOR A LASER SOURCE AND LASER SOURCE COMPRISING SUCH A PUMPING SYSTEM

FIELD OF THE INVENTION

The present invention relates to a pumping system for a laser source and to a laser source comprising such a pumping system.

BACKGROUND OF THE RELATED ART

More precisely, said laser source is of the known type, comprising:
- an active element comprising a doped matrix capable of absorbing a pump beam in order to amplify at least one beam of laser radiation;
- a pumping system, comprising pump (laser) diodes capable of emitting a pump beam penetrating into said rod;
- an optical transport system for directing the pump beam emitted by said pumping system into said active element so as to pump said active element; and
- an optical cavity for extracting said laser radiation.

In this laser source to which the present invention relates, the pumping may be in a longitudinal, transverse, semi-transverse or other orientation relative to said active element.

It is known that, to be effective, the pump beam must be spectrally tuned to the absorption spectrum of the active element in such a way that said pump beam is absorbed and transfers its energy into the rare-earth ions that dope said active element.

It is also known that pump laser diodes have an emission spectrum, generally a few nanometers in width, which is shifted by 0.25 to 0.3 nanometers per degree when the temperature of said pump diodes changes.

To ensure satisfactory conformity of the wavelength of the pump beam (output by the pump diodes) with the absorption spectrum of the active medium, it is known to mount said diodes on Peltier modules, the function of which is to stabilize their temperature with an accuracy of better than 0.5° C. so that wavelength centering to within 0.2 nm is ensured.

However, especially in the case of military applications, compactness, consumption and implementation rapidity parameters assume a particular importance. Thus, the use of Peltier modules, which involves considerable consumption and requires a stabilization time of the order of one minute, is a retarding factor on the use of diode-pumped laser sources in compact systems. The same applies in the case of other active systems for stabilizing the temperature of the diodes. Thus, the technology always employed at the present time, for example for terrestrial laser designators, is that of a flash pump, which is not very efficient and is bulky.

To try to remedy this problem, it is necessary:
- either to increase the tolerance of the active medium to the wavelength drift, which is proposed for example by Patent FR-2 803 697, for which the pump beam is guided in order to pass several times through the active medium;
- or to passively stabilize the emission of the wavelength of the pump diodes, as proposed for example in patent application US-2005/0018743, which describes the use of a system including one or more VBGs (Volume Bragg Gratings) so as to partition one or more of the emission characteristics of the laser.

However, the above solutions only allow an insensitivity over 3 to 10 nanometers to be obtained, corresponding to a temperature drift of the diodes of 15 to 40° C. Such a thermal insensitivity range is largely insufficient for using the pumping system, for example in a terrestrial laser designator, between −40° C. and 70° C.

SUMMARY OF THE INVENTION

The object of the present invention is to remedy these drawbacks. It relates to a pumping system for a laser source, making it possible to obtain a pump beam having an extremely extended thermal insensitivity range, for example between −40° and +70° C.

For this purpose, according to the invention, said pumping system for a laser source, of the type comprising:
- at least one pump (laser) diode capable of emitting at least one pump beam, the wavelength of which varies with temperature;
- at least one collimation means associated with said pump diode; and
- at least one selective mirror for selecting one wavelength of said pump diode, is noteworthy in that said selective mirror is formed so as to comprise a plurality of spectral reflectivity peaks for locking the operation of said pump diode each time onto at least one of these peaks upon a change in temperature of said pump diode so that the pumping system emits a pump beam whose wavelength varies in steps, corresponding in succession to a plurality of predetermined wavelengths upon said change in temperature.

Preferably, said predetermined wavelengths correspond to wavelengths for which an absorption coefficient of an active element for the laser source (which is associated with said pumping system) is each time greater than a predetermined (high) value, for example 1.7 cm$^{-1}$, that is to say for which a high absorption of the pump beam by the active element associated with the laser source is obtained.

Thus, thanks to the characteristics according to the invention of said selective mirror, when the temperature varies, the wavelength of the pump beam emitted by the pumping system does not vary (proportionally) in a continuous manner, but varies in steps, each time taking one or more wavelength values which ensure good absorption of said pump beam by the active element, that is to say particularly effective pumping. A pump beam having a particularly extended thermal insensitivity range is therefore obtained.

Advantageously, said selective mirror is formed in such a way that said predetermined wavelengths correspond to wavelengths for which said absorption coefficient each time forms part of the same relatively limited range of absorption coefficients, for example [1.7 cm$^{-1}$; 2.2 cm$^{-1}$]. Thanks to this feature, relatively uniform pumping is obtained in the active medium, whatever the temperature.

Within the context of the present invention, said selective mirror may be produced in various ways. In particular:
- it may comprise Bragg gratings formed in at least one solid medium; or
- it may comprise dielectric multilayers deposited on substrates; or
- it may be produced so as to generate a Fabry-Pérot effect, using interference between two reflecting surfaces.

The present invention also relates to a laser source of the type comprising:
- an active element comprising a doped matrix capable of absorbing at least one pump beam in order to amplify at least one beam of laser radiation;
- a pumping system capable of emitting at least one pump beam;

an optical transport system for directing the pump beam emitted by said pumping system into said active element so as to pump said active element; and an optical cavity for extracting said laser radiation.

According to the invention, said laser source is noteworthy in that said pumping system is of the aforementioned type.

BRIEF DESCRIPTION OF THE DRAWINGS

The figures of the appended drawing will make it clearly understood how the invention can be realized. In these figures, identical references denote similar elements.

DETAILED DESCRIPTION OF THE INVENTION

Figure 1:
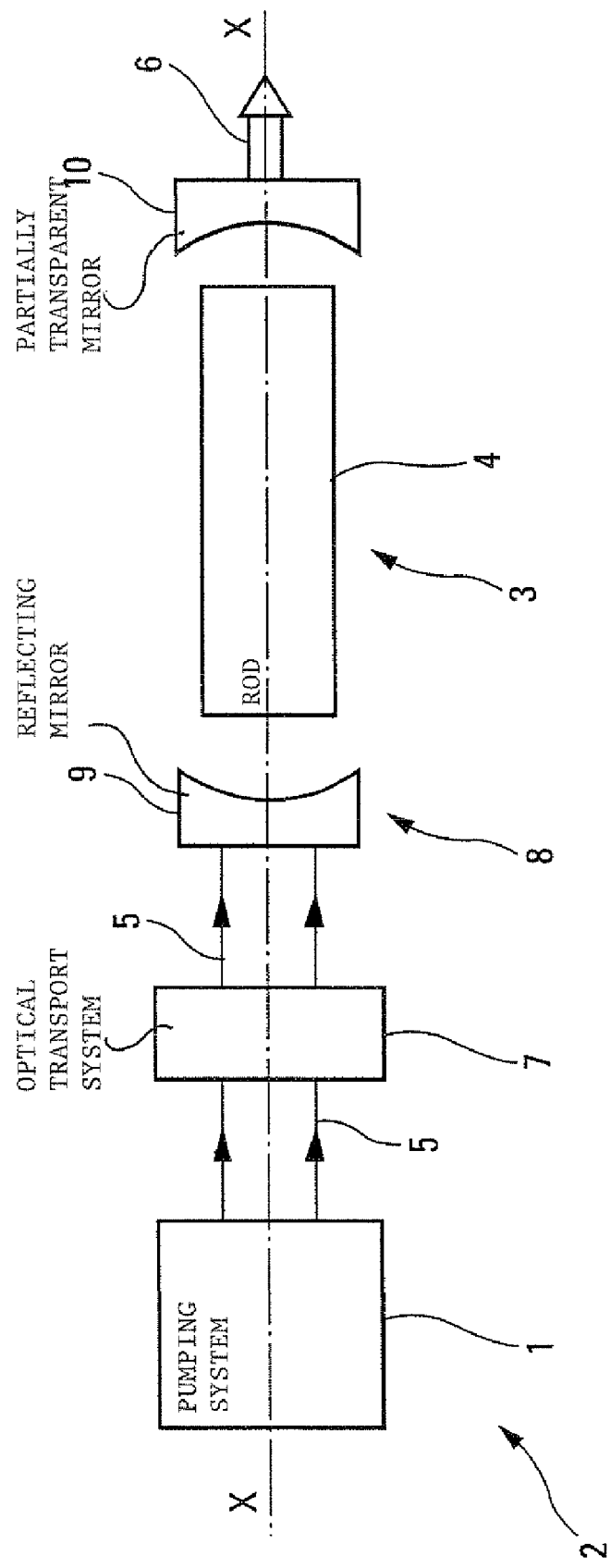
FIG. 1 is a simplified diagram of one exemplary embodiment of a laser source according to the invention.
Figure 2:
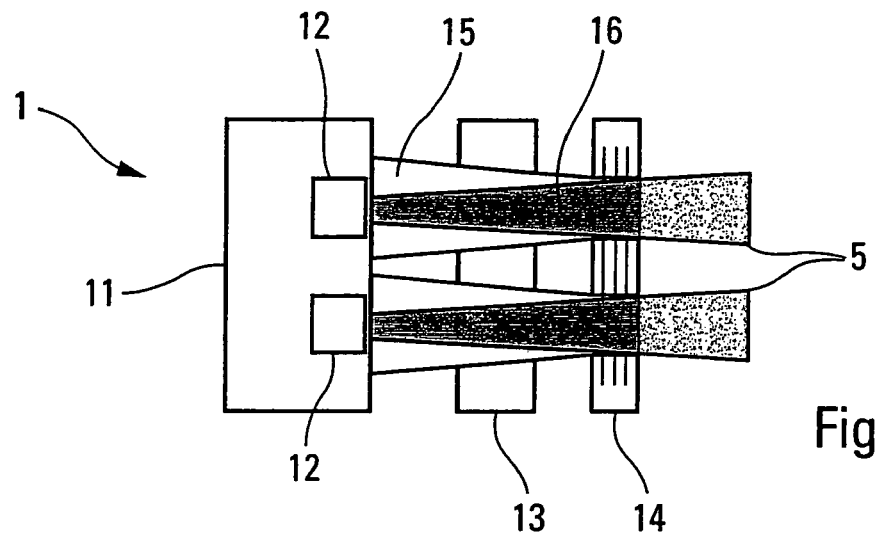
FIGS. 2 and 3 are schematic views, above and from the side respectively, of a pumping system according to the invention.
Figure 3:
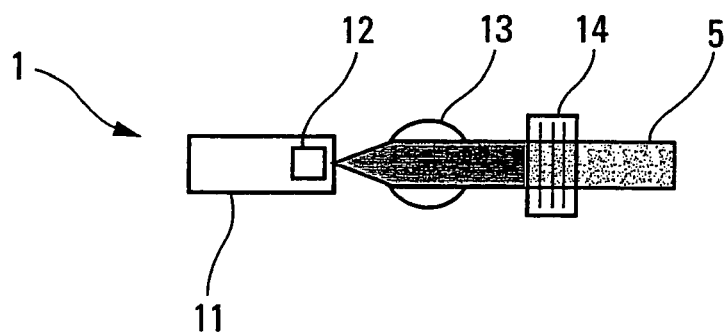

The pumping system 1 according to the invention, shown schematically in FIGS. 2 and 3, may be integrated into a laser source 2 as shown for example in FIG. 1.

Said laser source 2 comprises, in the usual manner:

an active element 3 comprising an elongate rod 4 consisting of a doped matrix capable of absorbing a pump beam 5, in order to amplify at least one beam of laser radiation 6 propagating longitudinally along an axis X-X;

said pumping system 1 explained below, which is capable of emitting at least one pump beam 5;

a standard optical transport system 7 for directing the pump beam 5 emitted by said pumping system 1 into said active element 3 so as to obtain longitudinal pumping; and a standard optical cavity 8, of axis X-X, comprising in particular a reflecting mirror 9 and a partially transparent mirror 10, which are placed facing each other. This optical cavity 8 gives the laser radiation 6 obtained by laser amplification and emitted through said mirror 10 along the X-X axis, its directional and geometrical characteristics.

Furthermore, said pumping system 1 includes at least one pump laser diode 12 which is for example mounted, in the usual manner, on a strip 11 and capable of emitting the pump beam 5, and also a standard collimation means 13, for example a lens, which is associated with said pump diode 12, as shown in FIGS. 2 and 3.

Figure 4:
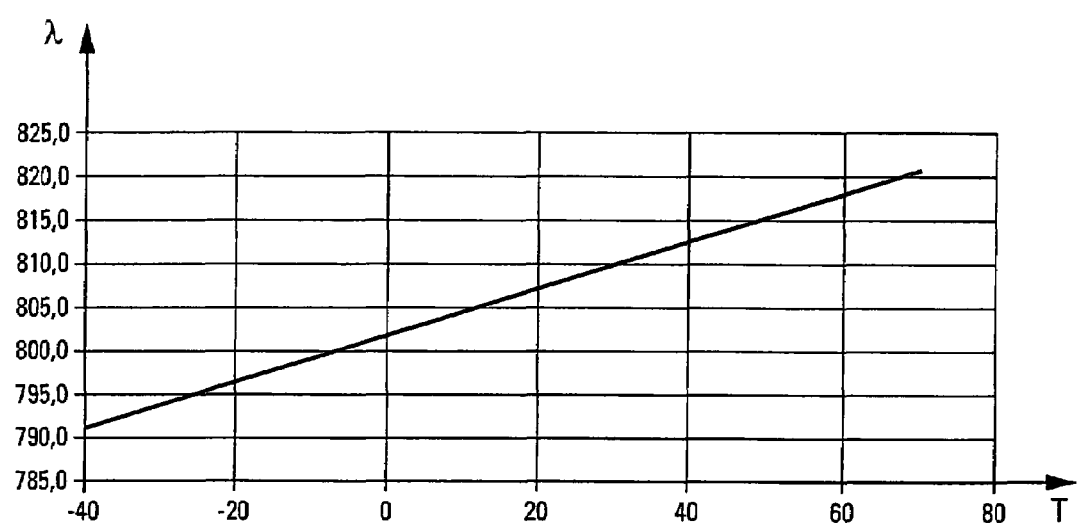
FIGS. 4 to 6 are graphs for explaining the essential features of the present invention.

It is known that such a pump diode 12 of the laser type generates a pump beam 5 whose wavelength $\lambda$ varies with temperature T, as shown in FIG. 4, in which $\lambda$ is expressed in nanometers and T in degrees Celsius. In general, laser diodes have an emission spectrum a few nanometers in width, which shifts by 0.25 to 0.3 nanometers per degree Celsius when the temperature T changes.

The object of the present invention is to remedy this drawback so as to obtain a pump beam 5 having a very extended thermal insensitivity range, for example between −40° C. and at least +70° C.

Figure 5:
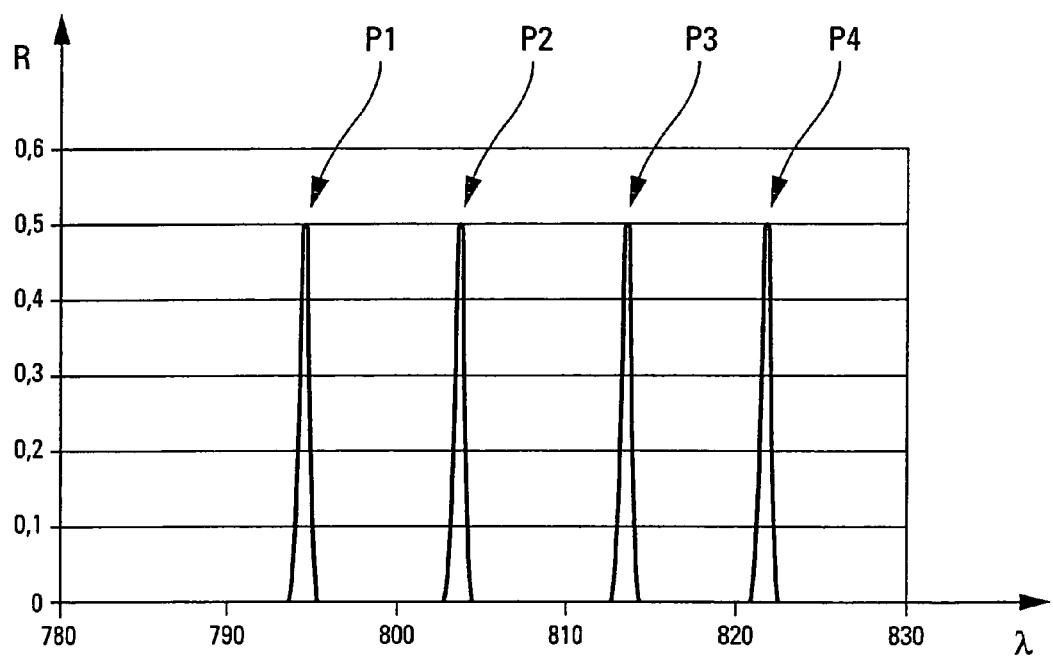
Figure 6:
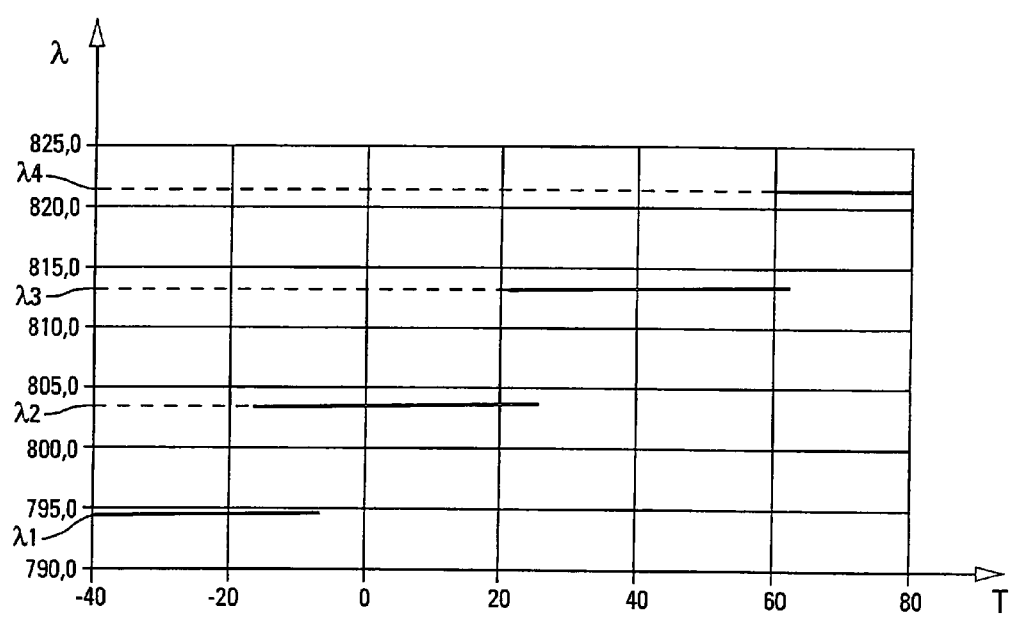

To do this, according to the invention, said pumping system 1 comprises, in addition, a selective mirror 14, explained below, which is formed so as to comprise a plurality of spectral reflectivity peaks P1, P2, P3, P4 (FIG. 5) in order to lock the operation of the pump laser diode(s) 12 onto at least one of these peaks P1 to P4 upon a change in temperature T of said pump laser diode 12 so that the pumping system 1 emits a pump beam 5 whose wavelength $\lambda$ varies in steps, corresponding in succession to a plurality of predetermined wavelengths $\lambda 1, \lambda 2, \lambda 3, \lambda 4$ as shown in FIG. 6, upon a change in temperature T.

Preferably, said predetermined wavelengths $\lambda 1, \lambda 2, \lambda 3$ and $\lambda 4$ correspond to wavelengths for which the absorption coefficient $\alpha$ of the active element 3 which is associated with said pumping system 1 is each time greater than a predetermined (high) value for example 1.7 cm$^{-1}$ in longitudinal pumping or else, for example 5 cm$^{-1}$ in transverse pumping, that is to say for which substantial absorption of the pump beam 5 by said associated active element 3 is obtained.

Thus, thanks to the features according to the invention of said selective mirror 14, when the temperature T varies, the wavelength of the pump beam 5 emitted by said pumping system 1 does not vary in a continuous manner as in the prior art shown in FIG. 4, but varies in steps, each time taking one or more wavelength values $\lambda 1$ to $\lambda 4$ (FIG. 6) which each ensure good absorption of said pump beam 5 by the active element 3, that is to say particularly effective pumping. A pump beam 5 having a particularly extended thermal insensitivity range, from −40° C. to 80° C. in the example shown in FIG. 6, is therefore obtained.

Preferably, said predetermined wavelengths $\lambda 1$ to $\lambda 4$ correspond to wavelengths for which said absorption coefficient $\alpha$ each time forms part of the same relatively limited range of absorption coefficients, for example [1.7 cm$^{-1}$; 2.2 cm$^{-1}$]. Thus, relatively uniform pumping is obtained in the active medium, whatever the temperature T.

Said selective mirror 14 therefore has a certain reflectivity R, at said spectral reflectivity peaks P1 to P4, which is fixed during the design and construction of this selective mirror 14. Placed in front of a collimated strip 11, this selective mirror 14 acts as a filter by reinjecting, by reflection in the gain medium, i.e. in the strip 11, radiation 15 that is spectrally refined, as shown in FIG. 2. The selective mirror 14 thus imposes, by this feedback, an additional constraint on the laser diodes 12 of the strip 11 so as to lock the operation of said laser diodes 12 each time on at least one of these spectral reflectivity peaks P1 to P4. This makes it possible to obtain in the end the spectral shift of the pump beam 5 as a function of temperature T, shown in FIG. 6.

The spectral gap between each of the spectral reflectivity peaks P1 to P4 must be smaller than the total spectral control amplitude of the mirror 14 in the configuration (of semiconductors, collimation and mirror) adopted.

Said selective mirror 14 may be produced in various ways.

In a first embodiment, it is produced from Bragg gratings, of the aforementioned type, which are formed in at least one solid medium. It is also possible to write several gratings each corresponding to one wavelength in a solid medium. These Bragg gratings may be interpenetrating or else may be located at different depths in the substrate, or else they may be written in a separate substrate, being placed one behind the other so as to constitute a multi-line mirror. In addition, the position of each reflection line (or spectral reflectivity peak) may be chosen independently of the other line positions.

In a second embodiment, said selective mirror 14 is produced in a usual manner by dielectric multilayers deposited on substrates.

Furthermore, in a third embodiment, said selective mirror 14 is produced in a standard manner using the interference between two reflective surfaces, generating a Fabry-Pérot effect. However, in this case, the position of each reflection line is interdependent on one another since it is possible only to modify the position of one reflection line independently, and also the free spectral interval separating it from the following reflection lines.

Moreover, said collimation means 13 has the purpose of collimating the radiation 16 of the diodes 12, at least along their rapid axis, before this radiation 16 reaches the selective mirror 14. This is because, without collimation, the angles of incidence of the rays on the selective mirror 14 would be too dispersed, because of the angular emission angle of the diodes 12, which typically reach 10×40°.

As an illustration, one particular pumping system 1 is now presented that allows effective longitudinal pumping of a YAG rod 4 with a length L=12 mm between −40° C. and 70° C.

To obtain a 90% absorption efficiency, the absorption coefficient α must reach at least 1.92 cm$^{-1}$, since the absorption Abs is in this case given by:

$$Abs=1-e^{(-\alpha L)}=1-e^{(-1.92\ cm^{-1}\times 1.2\ cm)}=0.9.$$

Moreover, if it is desired to deposit a relatively constant amount of pumping energy for each wavelength step λ, this absorption must remain close to 1.9, i.e. approximately between 1.7 and 2.2 cm$^{-1}$.

It is known that, over the absorption spectrum of YAG doped with 1% neodymium Nd, there are twelve regions of a few hundred picometers each satisfying this condition, giving the following coordinates (in nanometers): {791.9; 793.4; 794.5; 796.0; 798.6; 803.6; 809.6; 811.6; 813.5; 816.9; 817.8; 821.6}

In order for the thermal range in question (−40° C. to 70° C.) to be conveniently covered, four spectral coordinates are for example selected, λ1, λ2, λ3 and λ4, which are separated from one another by at least 10 nm, i.e. {794.5; 803.6; 813.5; 821.6} and at least one quadruple-band selective mirror 14, having the reflectivity R shown in FIG. 5, is produced.

This quadruple-band selective mirror 14 is positioned in front of a strip 11, which is collimated by a collimation means 13 so that a pump beam 5 having in succession said wavelengths λ1, λ2, λ3, λ4 as a function of temperature T, as shown in FIG. 6, is obtained.

Figure 7:
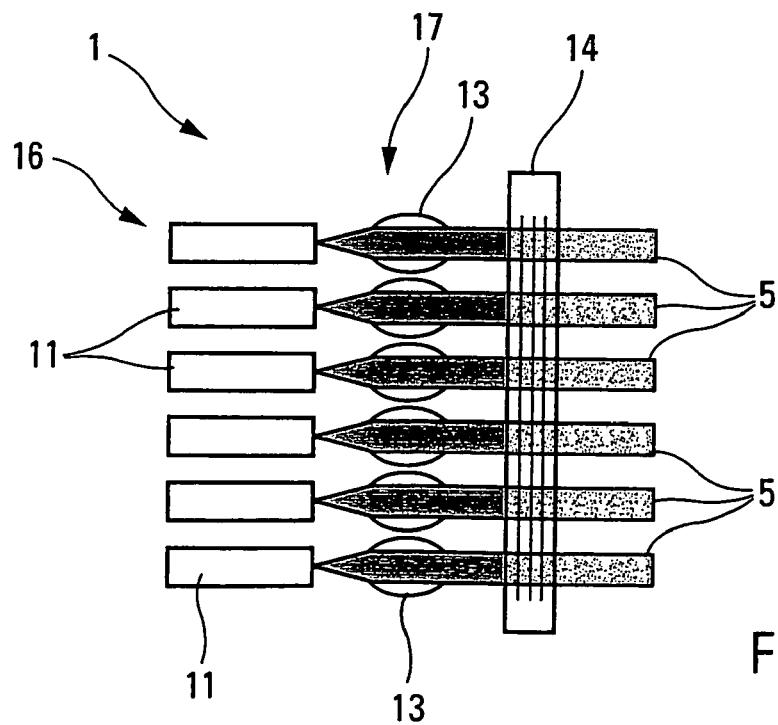
FIG. 7 shows schematically one particular embodiment of a pumping system according to the invention.

Within the context of the present invention, the pumping system 1 may comprise in particular a single pump diode 12, or a strip 11 provided with a plurality of such diodes 12, as shown in FIGS. 2 and 3, or an array 16 (or stack) of strips 11 as shown in FIG. 7.

In the latter example, an array 17 comprising a number of collimation means 13 may also be provided.

In addition, in this latter example, the following may be provided:
a single mirror 14 for the array 16 of strips 11; or
one selective mirror 14 for each strip 11 of said array 16; or
one selected mirror per group of several strips 11.

Although in the examples described above the pumping system 1 according to the invention is associated with a laser source 2 with longitudinal pumping, it will be readily understood that this pumping system may be employed for any other type of pumping, for example transverse, semi-transverse or other pumping.

The invention claimed is:

1. A pumping system for a laser source, said pumping system comprising:
at least one pump diode configured to emit at least one pump beam, wherein the wavelength of said pump diode varies with temperature;
at least one collimator that receives and collimates said pump beam emitted from said pump diode; and
at least one selective mirror for selecting one wavelength of said pump diode, wherein said selective mirror is configured to comprise simultaneously a plurality of spectral reflectivity peaks, having particular separated wavelengths, for locking the operation of said pump diode each time onto at least one of these spectral reflectivity peaks upon a change in temperature of said pump diode so that the pumping system emits a pump beam having a plurality of distinct wavelengths that respectively represent the particular separated wavelengths of the reflectivity peaks, corresponding in succession to a plurality of predetermined wavelengths upon said change in temperature, wherein the pump beam has an extended thermal insensitivity range between at least −40° C. and +70° C.

2. The pumping system as claimed in claim 1, characterized in that said selective mirror is formed in such a way that said predetermined wavelengths correspond to wavelengths for which an absorption coefficient of an active element for the laser source obtains a substantial absorption of the pump beam by the active element.

3. The pumping system as claimed in claim 2, characterized in that said selective mirror is formed in such a way that said predetermined wavelengths correspond to wavelengths for which said absorption coefficient each time forms part of the same range of absorption coefficients.

4. The system as claimed in claim 1, characterized in that said selective mirror comprises Bragg gratings formed in at least one solid medium.

5. The system as claimed in claim 1, characterized in that said selective mirror comprises dielectric multilayers deposited on substrates.

6. The system as claimed in claim 1, characterized in that said selective mirror is produced so as to generate a Fabry-Perot effect, using interference between two reflecting surfaces.

7. A laser source comprising:
an active element comprising a doped matrix capable of absorbing at least one pump beam in order to amplify at least one beam of laser radiation;
a pumping system capable of emitting at least one pump beam;
an optical transport system for directing the pump beam emitted by said pumping system into said active element so as to pump said active element; and
an optical cavity for extracting said laser radiation, characterized in that said pumping system is of the type of that specified in claim 1.

* * * * *